(12) United States Patent
Ishikawa et al.

(10) Patent No.: US 10,551,975 B2
(45) Date of Patent: Feb. 4, 2020

(54) SWITCHING DEVICE

(71) Applicant: FUJITSU TEN LIMITED, Kobe-shi, Hyogo (JP)

(72) Inventors: Tomoaki Ishikawa, Kobe (JP); Chiyohiko Kobayashi, Kobe (JP)

(73) Assignee: FUJITSU TEN LIMITED, Kobe-shi (JP)

( * ) Notice: Subject to any disclaimer, the term of this patent is extended or adjusted under 35 U.S.C. 154(b) by 298 days.

(21) Appl. No.: 15/419,683

(22) Filed: Jan. 30, 2017

(65) Prior Publication Data

US 2017/0235391 A1 Aug. 17, 2017

(30) Foreign Application Priority Data

Feb. 16, 2016 (JP) .................. 2016-027177

(51) Int. Cl.
*G06F 3/044* (2006.01)
*H03K 17/96* (2006.01)

(52) U.S. Cl.
CPC ........... *G06F 3/044* (2013.01); *H03K 17/962* (2013.01); *H03K 17/9622* (2013.01); *H03K 2217/96079* (2013.01); *H03K 2217/960755* (2013.01)

(58) Field of Classification Search
CPC combination set(s) only.
See application file for complete search history.

(56) References Cited

U.S. PATENT DOCUMENTS

| 2008/0237018 | A1 | 10/2008 | Tatehata et al. | |
| 2012/0103779 | A1* | 5/2012 | Hsu | G06F 3/0416 200/600 |
| 2012/0188385 | A1* | 7/2012 | Miyake | G02B 6/4214 348/207.99 |
| 2013/0027633 | A1* | 1/2013 | Park | B32B 7/14 349/62 |
| 2013/0127770 | A1* | 5/2013 | Trend | G06F 3/044 345/174 |
| 2017/0108960 | A1* | 4/2017 | Lee | B32B 27/06 |
| 2017/0139513 | A1* | 5/2017 | Hong | G02B 26/005 |
| 2017/0220174 | A1* | 8/2017 | Kim | G06F 3/044 |

FOREIGN PATENT DOCUMENTS

| JP | 2011-014280 A | 1/2011 |
| JP | 2011-242910 A | 12/2011 |
| JP | 2015-185370 A | 10/2015 |
| KR | 101583221 B1 | 1/2016 |
| WO | 2010/035705 A1 | 4/2010 |

OTHER PUBLICATIONS

Dec. 3, 2019 Office Action issued in Japanese Patent Application No. 2016-027177.

* cited by examiner

*Primary Examiner* — Deeprose Subedi (74) *Attorney, Agent, or Firm* — Oliff PLC

(57) ABSTRACT

A switching device according to an embodiment includes a circuit board, a laminated body, and an air layer. The circuit board is provided with an electrode which detects change in electrostatic capacitance that is caused by a touch operation of a user. The laminated body is laminated on the circuit board, and includes a touch panel member that receives the touch operation. The air layer is arranged at a position that corresponds to the electrode between the circuit board and the laminated body.

15 Claims, 10 Drawing Sheets

SWITCHING DEVICE

CROSS-REFERENCE TO RELATED APPLICATION

This application is based upon and claims the benefit of priority of the prior Japanese Patent Application No. 2016-027177, filed on Feb. 16, 2016, the entire contents of which are incorporated herein by reference.

FIELD

The embodiment discussed herein is directed to a switching device.

BACKGROUND

Conventionally, there is known an electrostatic capacitance-type switching device, as a switching device that operates ON/OFF of a switch by a touch of a finger of a user or the like to a specific part thereof, which turns ON/OFF on the basis of change in electrostatic capacitance between a finger of a user or the like and an electrode provided on a circuit board (for example, Japanese Laid-open Patent Publication No. 2011-242910).

The switching device has a configuration in which a laminated body including a touch panel member that receives a touch operation of a user is laminated on a surface of a circuit board.

However, the switching device according to the aforementioned conventional technology may be strained, for example, at the time of attachment to a vehicle or by external stress such as strong pressure. In this case, an unintended minute gap may be generated between the circuit board and each of the members that constitute the laminated body, and thus, touch detection caused by a touch operation on the touch panel member may be unstable.

One aspect of the embodiment is made in view of the aforementioned, and an object thereof is to provide a switching device that can prevent touch detection caused by a touch operation to a touch panel member from being unstable.

SUMMARY

According to an aspect of the embodiment, a switching device includes a circuit board, a laminated body, and an air layer. The circuit board is provided with an electrode which detects change in electrostatic capacitance that is caused by a touch operation of a user. The laminated body is laminated on the circuit board, and includes a touch panel member that receives the touch operation. The air layer is arranged at a position that corresponds to the electrode between the circuit board and the laminated body.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF EMBODIMENT

Hereinafter, an exemplary embodiment of a switching device disclosed in the present application will be described in detail with reference to the accompanying drawings. First, an outline of a switching device according to the present invention will be explained with reference to FIGS. 1A and 1B, and then, an exemplary embodiment of the switching device according to the present invention will be explained with reference to FIGS. 2 to 8. Moreover, it is not intended that this invention be limited to the embodiment described below.

Figure 1A:
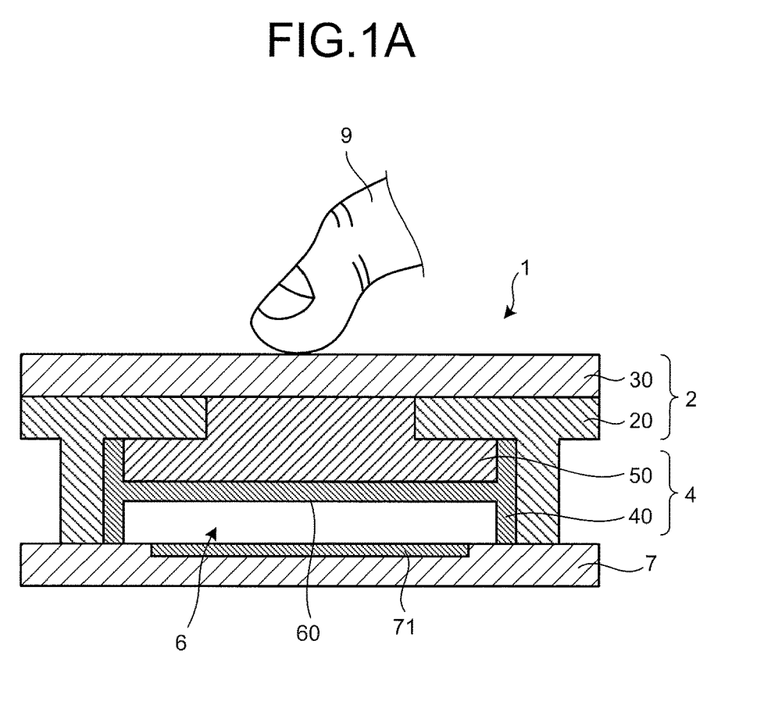
FIG. 1A is a schematic cross-sectional view illustrating a switching device according to an embodiment.

FIG. 1A is a schematic cross-sectional view illustrating a switching device 1 according to the embodiment. The switching device 1 according to the embodiment includes a circuit board 7, a light guiding body 4, and a panel body 2.

On a surface of the circuit board 7, an electrode 71 is provided, which detects change in electrostatic capacitance that is caused by a touch operation of a user. The light guiding body 4 and the panel body 2 are laminated and arranged on a surface of the circuit board 7. The light guiding body 4 and the panel body 2 are one example of a laminated body.

The light guiding body 4 includes a light guiding member 50 that guides light toward an operation panel side of the panel body 2, and a holding member 40 that holds a back face of the light guiding member 50. The holding member 40 is arranged at the position that is opposite to the electrode 71 on the surface of the circuit board 7.

The panel body 2 includes a touch panel member 30 that receives a touch operation of a finger 9 or the like, and a panel supporting member 20 that supports a back face of the touch panel member 30 and includes an internal space in which the light guiding body 4 is stored.

The switching device 1 according to the embodiment includes an air layer 6 between the circuit board 7 and the holding member 40. Specifically, the switching device 1 includes the air layer 6, which covers the electrode 71, at the position that corresponds to the electrode 71 on a surface of the holding member 40 which is opposite to the circuit board 7. The thickness of the air layer 6 is, for example, 0.1 to 0.5 mm. Specifically, the thickness of the air layer 6 is 0.2 to 0.4 mm. More specifically, the thickness of the air layer 6 is 0.3 mm.

In the present embodiment, the air layer 6 is a space that is formed by a concave part 60 arranged at the position corresponding to the electrode 71 on the surface of the holding member 40 which is opposite to the circuit board 7.

Thus, the switching device 1 according to the present embodiment includes the air layer 6 formed by the concave part 60, which is arranged at the position corresponding to the electrode 71 on the surface of the holding member 40 which is opposite to the circuit board 7.

Thereby, even when the panel body 2 and the circuit board 7 are strained by external stress to generate an unintended minute gap between, for example, the circuit board 7 and the light guiding body 4, the switching device 1 according to the embodiment can keep a change rate of electrostatic capacitance of the light guiding body 4 low by the air layer 6.

Therefore, the change rate of electrostatic capacitance of the light guiding body 4 of the switching device 1 according to the embodiment is low, and thus, the amount of change in electrostatic capacitance between the finger 9 or the like, which has touched the touch panel member 30, and the electrode 71 is approximately the same as that in a case where the panel body 2 or the circuit board 7 is not strained.

For this reason, even when the panel body 2 and the circuit board 7 are strained to generate an unintended minute gap between the circuit board 7 and the light guiding body 4, the switching device 1 according to the embodiment can prevent touch detection caused by a touch operation of the finger 9 or the like on the touch panel member 30 from being unstable.

Figure 1B:
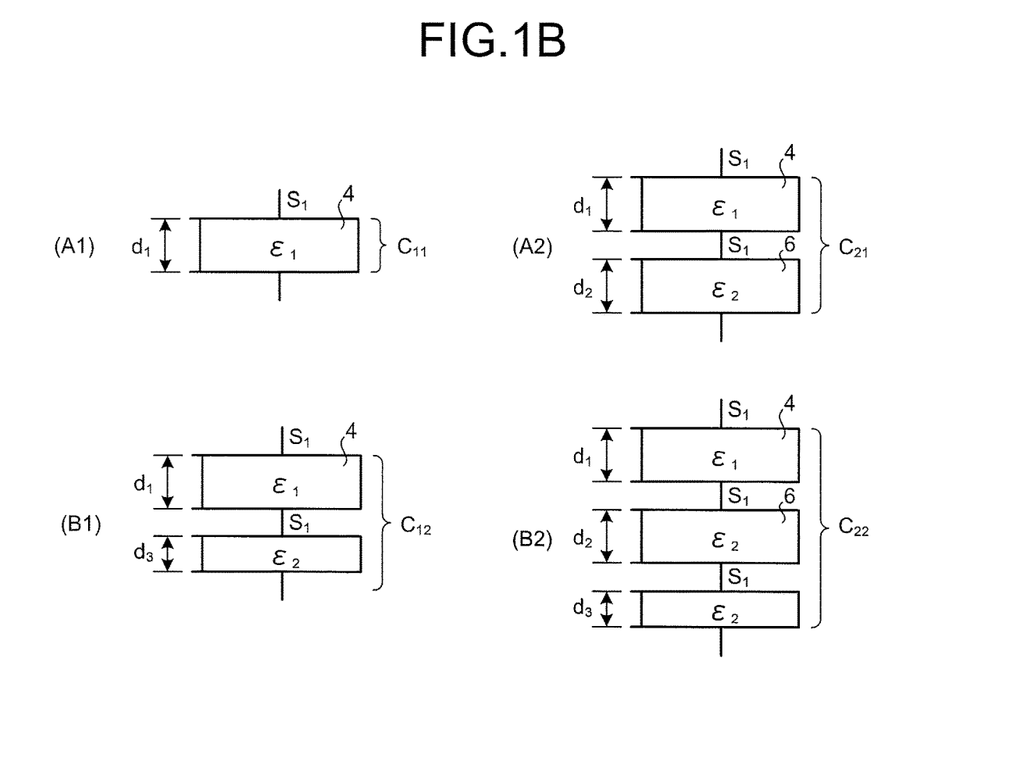
FIG. 1B is a diagram illustrating change in electrostatic capacitance of a light guiding body included in the switching device according to the embodiment.

The change in electrostatic capacitance of the light guiding body 4, which is associated with deformation caused by the strain of the panel body 2 and the circuit board 7, will be explained with reference to FIG. 1B. FIG. 1B is a diagram illustrating change in electrostatic capacitance of the light guiding body 4 included in the switching device 1 according to the embodiment.

As illustrated in FIG. 1B (A1), electrostatic capacitance $C_{11}$ of the light guiding body 4, in a case where the panel body 2 or the circuit board 7 is not strained in an ordinary switching device that does not include the air layer 6, may be expressed by a relational formula that is described as the following formula (1). The ordinary switching device is the switching device 1 in FIG. 1A in which the concave part 60 is not arranged in the holding member 40 and the circuit board 7 is in contact with a bottom face of the holding member 40.

$$C_{11} = \varepsilon_1 \cdot S_1 / d_1 \tag{1}$$

In the aforementioned formula (1), "$\varepsilon_1$" is the electric permittivity of the light guiding body 4, "$S_1$" is the area of the light guiding body 4, and "$d_1$" is the thickness of the light guiding body 4.

Next, as illustrated in FIG. 1B (B1), electrostatic capacitance $C_{12}$ of the light guiding body 4 in a case where the panel body 2 and the circuit board 7 are strained in the ordinary switching device, may be expressed by a relational formula that is described as the following formula (3) on the basis of the aforementioned formula (1) and the following formula (2).

$$1/C_{12} = 1/C_{11} + 1/C_A \tag{2}$$

$$C_{12} = 3\varepsilon_2 S_1 / (d_1 + 3d_3) \tag{3}$$

In the aforementioned formula (2), "$C_A$" is the electrostatic capacitance of air in a minute gap that is generated between the circuit board 7 and the light guiding body 4 by the strain of the panel body 2 and the circuit board 7. Herein, "$\varepsilon_2$" is the electric permittivity of air, and "$d_3$" is the thickness of a minute gap. Moreover, "$\varepsilon_1 = 3\varepsilon_2$" as a condition.

In the ordinary switching device, the amount of change ($\Delta C_1 = C_{11} - C_{12}$) in electrostatic capacitance of the light guiding body 4 before and after the strain of the panel body 2 and the circuit board 7 may be expressed by a relational formula that is described as the following formula (4) on the basis of the aforementioned formulae (1) and (3).

$$\Delta C_1 = 9\varepsilon_2 S_1 d_3 / \{d_1(d_1 + 3d_3)\} \tag{4}$$

On the other hand, as illustrated in FIG. 1B (A2), in the switching device 1 that includes the air layer 6, electrostatic capacitance $C_{21}$ that is constituted of those of the light guiding body 4 and the air layer 6 in a case where the panel body 2 or the circuit board 7 is not strained may be expressed by a relational formula that is described as the following formula (6) on the basis of the aforementioned formula (1) and the following formula (5).

$$1/C_{21} = 1/C_{11} + 1/C_{22} \tag{5}$$

$$C_{21} = 3\varepsilon_2 S_1 / (d_1 + 3d_2) \tag{6}$$

In the aforementioned formula (5), "$C_{22}$" is the electrostatic capacitance of the air layer 6. In the aforementioned formula (6), "$d_2$" is the thickness of the air layer 6.

Next, as illustrated in FIG. 1B (B2), in the switching device 1 that includes the air layer 6, electrostatic capacitance $C_{22}$ that is constituted of those of the light guiding body 4 and the air layer 6 in a case where the panel body 2 and the circuit board 7 are strained may be expressed by a relational formula that is described as the following formula (8) on the basis of the aforementioned formula (6) and the following formula (7).

$$1/C_{22} = 1/C_{21} + 1/C_A \tag{7}$$

$$C_{22} = 3\varepsilon_2 S_1 / (d_1 + 3d_2 + 3d_3) \tag{8}$$

In the switching device 1 that includes the air layer 6, the amount of change ($\Delta C_2 = C_{21} - C_{22}$) in electrostatic capacitance constituted of those of the light guiding body 4 and the air layer 6 before and after the strain of the panel body 2 and the circuit board 7 may be expressed by a relational formula that is described as the following formula (9) on the basis of the aforementioned formulae (6) and (8).

$$\Delta C_2 = 9\varepsilon_2 S_1 d_3 / \{(d_1 + 3d_2)(d_1 + 3d_2 + 3d_3)\} \tag{9}$$

From the aforementioned result, when the amount of change (aforementioned formula (4)) in electrostatic capacitance of the light guiding body 4 in the ordinary switching device is compared with the amount of change (aforementioned formula (9)) in electrostatic capacitance that is constituted of those of the light guiding body 4 and the air layer 6 in the switching device 1, it can be found that the amount of change in electrostatic capacitance that is constituted of those of the light guiding body 4 and the air layer 6 is smaller.

Therefore, the switching device 1 according to the embodiment includes the air layer 6, so that it is possible to keep a change rate of electrostatic capacitance of the light guiding body 4 low, and thus, even when the panel body 2 and the circuit board 7 are strained, touch detection caused by a touch operation of the finger 9 or the like on the touch panel member 30 is stable.

Figure 2:
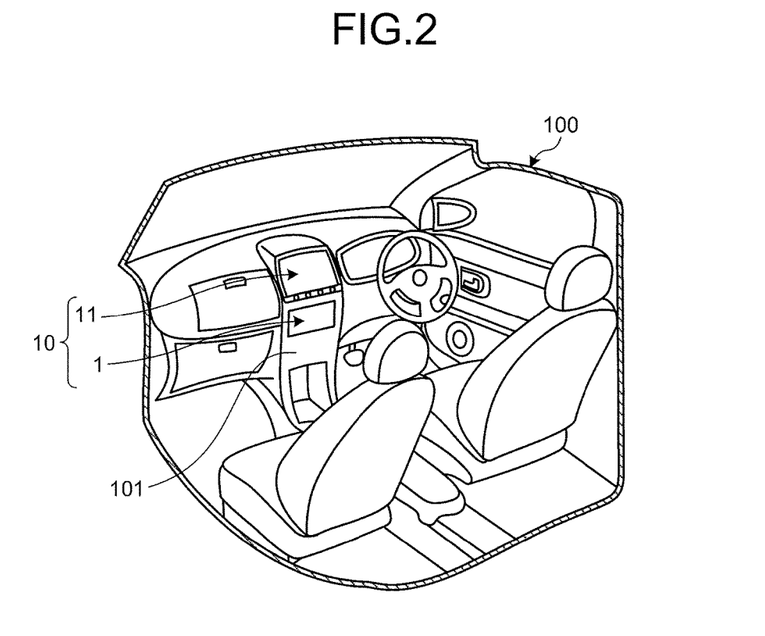
FIG. 2 is a diagram illustrating an example of application of the switching device according to the embodiment.

Next, an example of application of the switching device 1 according to the embodiment will be explained with reference to FIG. 2. FIG. 2 is a diagram illustrating an example of application of the switching device 1 according to the embodiment.

As illustrated in FIG. 2, an on-vehicle device 10 is mounted on a vehicle 100. The on-vehicle device 10 includes a display device 11 and the aforementioned switching device 1.

The display device 11 is, for example, a liquid crystal display, and fixed on an instrument panel 101 of the vehicle 100. The display device 11 is connected to a navigation device (not illustrated) and the like, and displays navigation information, a one-segment broadcast, etc.

The switching device 1 is fixed on the instrument panel 101 of the vehicle 100. The switching device 1 is connected to an audio device (not illustrated) and the like, and performs a selecting operation of a radio station, a selecting operation of a number in a Compact Disk (CD), etc. Thus, the switching device 1 functions as an input device to which an operation instruction of a user for the audio device or the like is input.

Meanwhile, for example, when a conventional switching device is attached to the instrument panel 101 of the vehicle 100, the body of the switching device may be strained by excess stress at the time of attachment thereof.

Therefore, a panel body and a circuit board of the switching device may be strained by the external stress, and thus, an unintended minute gap may be generated between the circuit board and the light guiding body. In the switching device, the touch detection caused by the touch operation to the touch panel member may be unstable.

Therefore, in the switching device 1 according to the present embodiment, the air layer 6 is arranged between the circuit board 7 and the light guiding body 4 to prevent touch detection caused by a touch operation to the touch panel member 30 from being unstable.

Next, a detailed configuration of the switching device 1 that is attached to the instrument panel 101 of the vehicle 100 according to the embodiment will be explained with reference to FIGS. 3 to 7.

For the convenience of explanation, in FIGS. 3 to 7, a three-dimensional orthogonal coordinate system is illustrated, in which the positive direction of the Z-axis is the upward vertical direction, the negative direction of the Z-axis is the downward vertical direction, the Y-axis represents the transverse (thickness) direction of the switching device 1, and the X-axis represents the longitudinal direction of the switching device 1.

In a state where the switching device 1 is attached to the instrument panel 101 of the vehicle 100, the X-axis of the orthogonal coordinate system represents the right/left direction of the vehicle 100, and the Y-axis represents the front/back direction of the vehicle 100.

In the following explanation, expressions such as "X-axis direction", "Y-axis direction", and "Z-axis direction" are used, and they mean "X-axis direction", "Y-axis direction", and "Z-axis direction" in a state where the switching device 1 is attached to the instrument panel 101 of the vehicle 100 as illustrated in the drawings, and not intended to limit directions.

Figure 3:
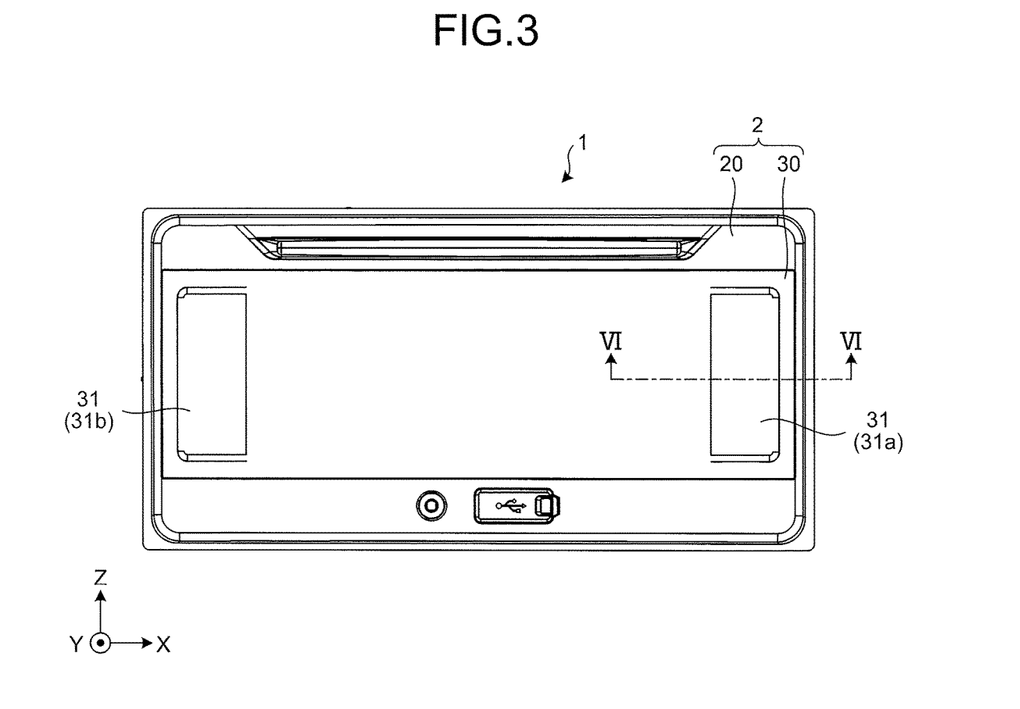
FIG. 3 is a plan view illustrating the switching device according to the embodiment.
Figure 4:
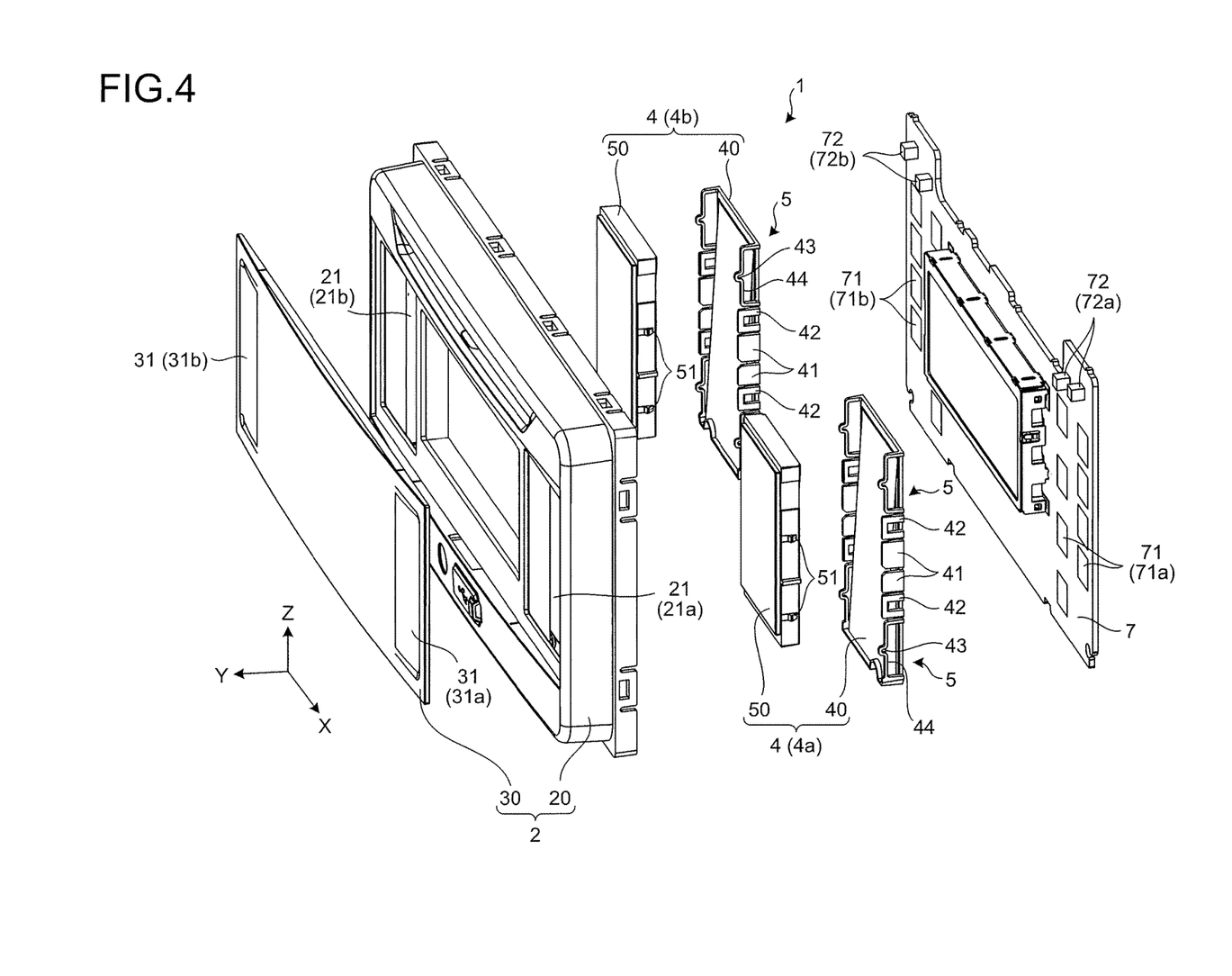
FIG. 4 is an exploded perspective view illustrating the switching device according to the embodiment.

First, the switching device 1 will be explained with reference to FIGS. 3 and 4. FIG. 3 is a plan view illustrating the switching device 1 according to the embodiment. FIG. 4 is an exploded perspective view illustrating the switching device 1 according to the embodiment. In FIGS. 3 and 4, illustration of the instrument panel 101 will be omitted.

As illustrated in FIGS. 3 and 4, the switching device 1 includes the panel body 2, the circuit board 7, and the light guiding bodies 4 (4a, 4b) that are arranged between the panel body 2 and the circuit board 7.

The panel body 2 includes the panel supporting member 20 and the touch panel member 30. The panel supporting member 20 supports a peripheral part of a back face of the touch panel member 30. The touch panel member 30 includes a operation displays 31 (31a, 31b) at one and the other edge sides of a surface thereof, respectively, in the X-axis direction. The operation displays 31 (31a, 31b) receive an instruction for operating the switching device 1 when a user touches with, for example, his/her finger to provide the instruction thereto.

Drawing patterns that indicate instruction contents such as TUNE, ENTER, MODE, VOL, and CH•FLD, are formed in the operation displays 31 (31a, 31b) corresponding to respective positions of a plurality of the electrodes 71 (see FIG. 4) that are arranged on the circuit board 7 to be mentioned later.

The panel supporting member 20 stores the light guiding bodies 4 at the positions corresponding to the operation displays 31 (31a, 31b) in a storing space (not illustrated) to include openings 21 (21a, 21b) in which front faces of the light guiding bodies 4 and the back face of the touch panel member 30 are contacted with each other.

The circuit board 7 includes a plurality of the electrodes 71 (71a, 71b) that function as touch sensors at one and the other edge sides of a surface thereof in the X-axis direction. Specifically, the electrodes 71 (71a, 71b) are arranged in an array shape at one and the other edge sides of the surface of the circuit board 7 in the X-axis direction. In the present example, the electrodes 71 (71a, 71b) are arranged in 4-by-2 matrices with respect to the Z-axis direction.

The circuit board 7 includes a component other than the electrodes 71 (71a, 71b) as a touch sensor, however, for the convenience of explanation, illustration and explanation thereof will be omitted. The touch sensor is an electrostatic capacitance type, and, when a finger of a user or the like approaches the electrodes 71 (71a, 71b), detects a touch on a part of the operation displays 31 (31a, 31b) corresponding to the electrodes 71 (71a, 71b) by utilizing change in electrostatic capacitance between the electrodes 71 (71a, 71b) and the finger or the like.

The circuit board 7 includes a light sources 72 (72a, 72b) at both edges on one edge side of a surface thereof in the Z-axis direction. The light sources 72 (72a, 72b) irradiate, with light, the operation displays 31 (31a, 31b) of the touch panel member 30 via the light guiding bodies 4 (4a, 4b). For example, a Light Emission Device (LED), etc. may be used as the light sources 72 (72a, 72b).

The light guiding bodies 4 (4a, 4b) are arranged at one and the other edge sides of the surface of the circuit board 7, respectively, in the X-axis direction. Specifically, the light guiding body 4a is arranged at one edge side of the surface of the circuit board 7 in the X-axis direction so that it covers the electrode 71a, and the light guiding body 4b is arranged at the other edge side of the surface of the circuit board 7 in the X-axis direction so that it covers the electrode 71b.

The light guiding bodies 4 (4a, 4b) include the light guiding members 50 and the holding members 40. The light guiding members 50 are approximately rectangular parallelepiped members that are made of highly light transmitting dielectric material such as polycarbonate resin or acrylic resin.

The front surface of the light guiding member 50 has a planar shape that is parallel to the XZ-plane, and the back face thereof is a planar shape that includes a slope with a gradient falling from the positive direction to the negative direction of the Z-axis. The light guiding member 50 includes engaging parts 51 at two points on each side surface in the X-axis direction, which are to be engaged with the holding member 40.

The holding member 40 holds a sloped surface (back face) of the light guiding member 50. The holding member 40 is an approximately rectangular or square plate-shaped member that is made of, for example, polycarbonate resin, Acrylonitrile-Butadiene-Styrene resin (ABS resin), a mixture (polymer alloy) thereof, or the like.

The holding member 40 includes wall parts 41 and engaged parts 42. The wall parts 41 stand along the YZ-plane at both edges of the holding member 40 in the X-axis direction, and are formed to have approximately rectangular or square plate shapes that contact with side surfaces of the light guiding member 50. The engaged parts 42 are formed at two positions at each of the edges of the holding member 40 in the X-axis direction to place the wall parts 41 there between, and engage with the engaging parts 51 of the light guiding member 50, respectively.

The holding member 40 further includes wall parts 5. The wall parts 5 are formed at two positions at each of the edges of the holding member 40 in the X-axis direction to place the engaged parts 42 there between, and are elastically deformed by contact with the panel supporting member 20. Each of the wall parts 5 includes an elastic part 44 that is circularly formed and a convex part 43 that contacts with a back face of the panel supporting member 20.

Figure 5:
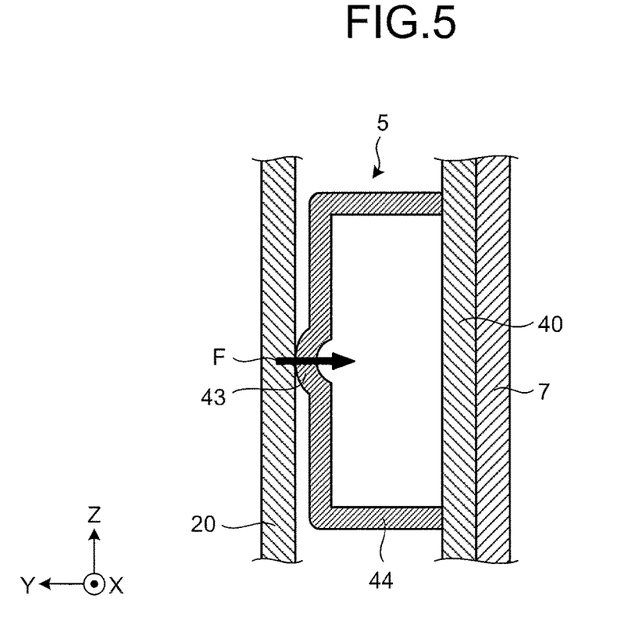
FIG. 5 is a partial view illustrating a contact relation between a holding member and a panel supporting member according to the embodiment.

Functions of the wall part 5 will be explained with reference to FIG. 5. FIG. 5 is a partial diagram illustrating a contact relation between the holding member 40 and the panel supporting member 20 according to the embodiment.

As illustrated in FIG. 5, when the switching device 1 is attached to the instrument panel 101 of the vehicle 100, force F acts, which pushes the panel supporting member 20 against the circuit board 7. The aforementioned force F acts on the convex part 43 of the wall part 5, and the elastic part 44 is elastically deformed to push the holding member 40 against the circuit board 7. By the pushing, the holding member 40 and the circuit board 7 are closely attached to each other.

Thereby, in the switching device 1 according to the embodiment, occurrence of abnormal noise can be prevented. In other words, if a gap is generated, for example, between the holding member 40 and the circuit board 7, abnormal noise occurs by vibration during running of the vehicle 100. However, in the switching device 1 according to the embodiment, the holding member 40 and the circuit board 7 are closely attached to each other as described above, and thus, occurrence of abnormal noise can be prevented.

By returning to explanation regarding FIG. 4, a front face of the holding member 40 has a planar shape that includes a slope with a gradient rising from the positive direction to the negative direction of the Z-axis, and a back face thereof has a planar shape parallel to the XZ plane. On the back face of the holding member 40, the concave parts 60 (see FIGS. 6 and 7) to be mentioned later are formed so as to correspond to the electrodes 71 (71a, 71b) that are arranged on the surface of the circuit board 7.

Figure 6:
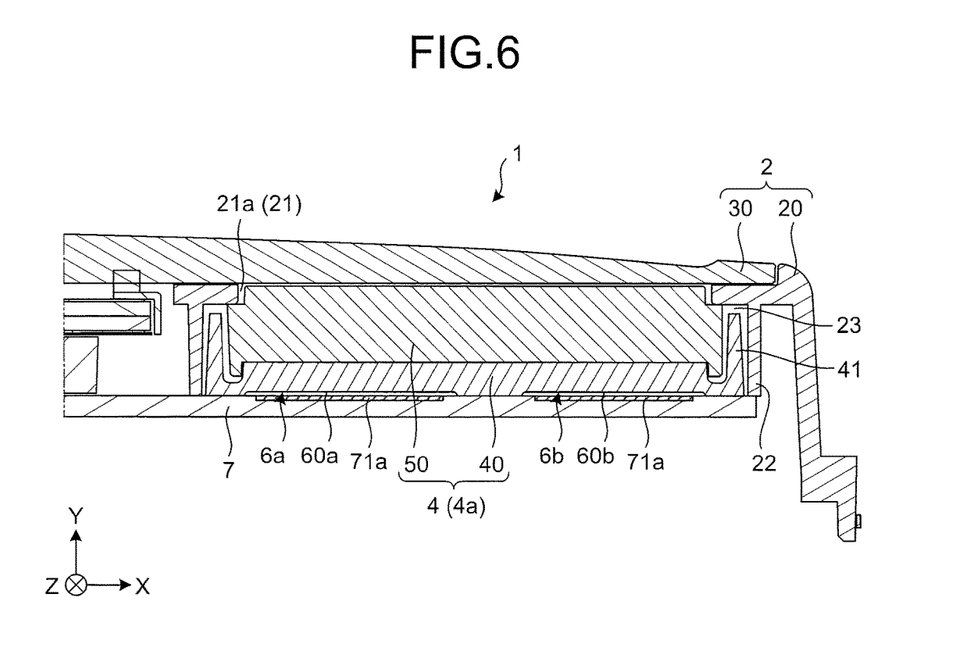
FIG. 6 is a schematic cross-sectional view illustrating the switching device according to the embodiment along line VI-VI in FIG. 3.
Figure 7:
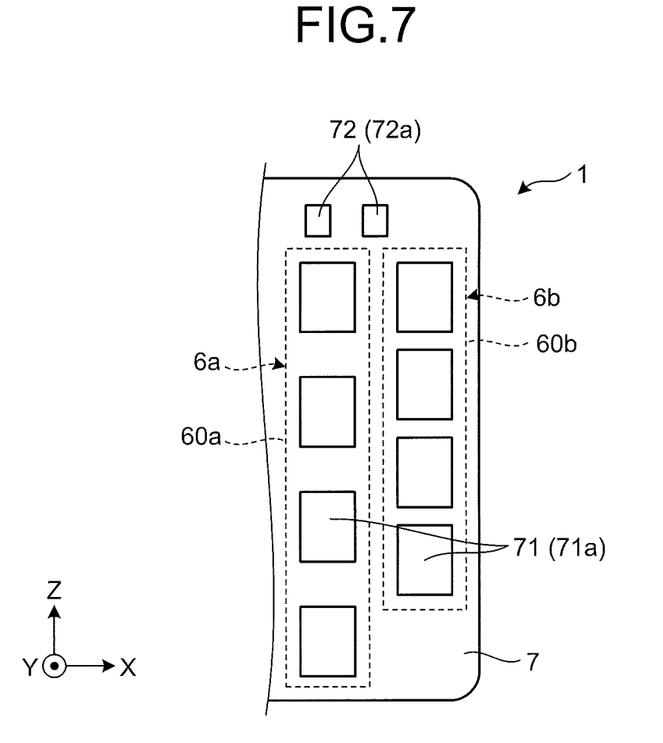
FIG. 7 is a diagram illustrating arrangement of concave parts according to the embodiment.

The concave parts 60 (60a, 60b) that are formed on the back face of the holding member 40 will be explained with reference to FIGS. 6 and 7. FIG. 6 is a schematic cross-sectional view illustrating the switching device 1 according to the embodiment along line VI-VI in FIG. 3. FIG. 7 is a diagram illustrating arrangement of concave parts 60 (60a, 60b) according to the embodiment.

Among components illustrated in FIGS. 6 and 7, components that have functions similar to those of the components illustrated in FIGS. 3 and 4 will be provided with the same reference symbols as those illustrated in FIGS. 3 and 4 to omit explanation thereof.

As illustrated in FIG. 6, the panel supporting member 20 includes a storing frame part 22 that stands along the YZ-plane and YX-plane on a back face part of the panel supporting member 20. An internal space 23 is formed by the storing frame part 22. In the internal space 23, the light guiding body 4 (4a) that is laminated on the surface of the circuit board 7 is stored. The two concave parts 60a and 60b are formed on the back face of the holding member 40 that constitutes the light guiding body 4 (4a) so as to correspond to a plurality of the electrodes 71 (71a) that are arranged on the surface of the circuit board 7.

Specifically, as illustrated in FIG. 7, the concave parts 60a and 60b are formed on the back face of the holding member 40 so as to cover the inside four electrodes 71a and the outside four electrodes 71a, which are aligned in the Z-axis direction on the surface of the circuit board 7. For the convenience of explanation, in FIG. 7, illustration of the holding member 40 is omitted and the concave parts 60a and 60b are illustrated by dashed lines.

In the present embodiment, a air layers 6a and 6b are formed by spaces that are formed by the concave parts 60a and 60b arranged on the back face of the holding member 40. In other words, the air layers 6a and 6b are arranged between the holding member 40 and the circuit board 7 so as to cover the inside four electrodes 71a and the outside four electrodes 71a, which are aligned in the Z-axis direction on the surface of the circuit board 7.

In the aforementioned, the light guiding body 4 (4a) that is laminated at one edge side on the surface of the circuit board 7 in the X-axis direction has been explained. A configuration of the light guiding body 4 (4b) that is laminated at the other edge side on the surface of the circuit board 7 in the X-axis direction is similar to that of the aforementioned. In other words, the two concave parts 60 (60a, 60b) are formed on the back face of the holding member 40 that constitute the light guiding body 4 (4b) so as to correspond to a plurality of the electrodes 71 (71b) that are arranged on the surface of the circuit board 7.

The switching device 1 according to the aforementioned embodiment includes the air layers 6a and 6b between the holding member 40 and the circuit board 7. The air layers 6a and 6b cover the inside four electrodes 71a and the outside four electrodes 71a that are aligned in the Z-axis direction on the surface of the circuit board 7, respectively.

Therefore, even when the panel body 2 and the circuit board 7 are strained by excess stress at the time of attachment to the instrument panel 101 of the vehicle 100 to generate an unintended minute gap between, for example, the circuit board 7 and the holding member 40, the switching device 1 according to the embodiment can keep a change rate of electrostatic capacitance of the light guiding body 4 (4a) low by the air layers 6a and 6b.

Therefore, in the switching device 1 according to the embodiment, a change rate of electrostatic capacitance of the light guiding bodies 4 (4a, 4b) is low, and thus, the amount of change in electrostatic capacitance between a finger or the like, which touches the touch panel member 30, and the electrodes 71 (71a, 71b) is approximately the same as that in a case where the panel body 2 or the circuit board 7 is not strained.

For this reason, even when the panel body 2 and the circuit board 7 are strained to generate an unintended minute gap between the circuit board 7 and the light guiding bodies 4 (4a, 4b), the switching device 1 according to the embodiment can prevent touch detection caused by a touch operation of a finger or the like on the touch panel member 30 from being unstable.

Figure 8:
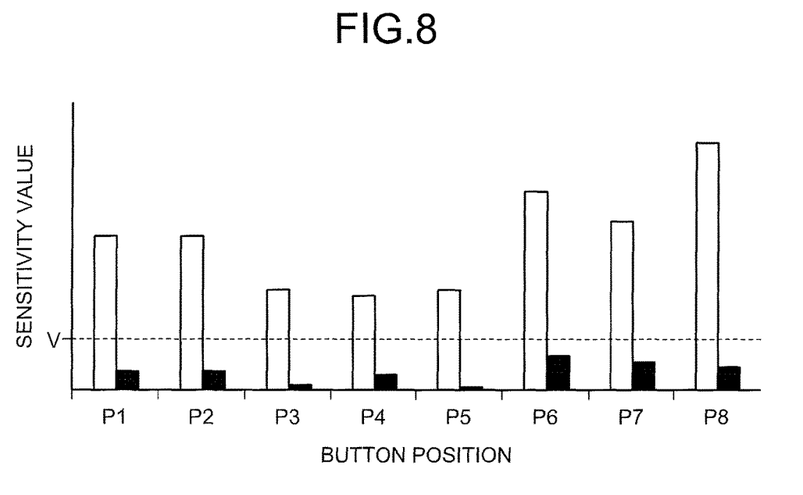
FIG. 8 is a diagram illustrating a sensitivity value of each of the buttons included in the switching device according to the embodiment.

Results of a test that evaluated performance of the switching device 1 that was attached to the instrument panel 101 of the vehicle 100 will be explained with reference to FIG. 8. FIG. 8 is a diagram illustrating a sensitivity value of each of the buttons included in the switching device 1 according to the embodiment.

In FIG. 8, the vertical axis illustrates a sensitivity value, and the horizontal axis illustrates a button position. Among button positions P1 to P8, the four button positions P1 to P4 were set to correspond to the inside four electrodes 71a on the surface of the circuit board 7 illustrated in FIG. 7, and the four button positions P5 to P8 were set to correspond to the outside four electrodes 71a on the surface of the circuit board 7.

Herein, "V" on the vertical axis illustrated in FIG. 8 is a threshold value for turning ON when a finger or the like touches the operation display 31 of the touch panel member 30 in the switching device 1. In the test, a central part other than the operation displays 31 of the touch panel member 30 was pushed by a finger to measure sensitivity values of the button positions P1 to P8 in the switching device 1 illustrated in FIG. 3. The thickness of the air layers 6a and 6b in this test was set at 0.3 mm. As illustrated by a black bar graph in FIG. 8, it can be found that the sensitivity values of the button positions P1 to P8 did not exceed the threshold value "V".

On the other hand, a test similar to the aforementioned was also conducted for an ordinary switching device that did not include the air layer 6a or 6b between the holding member 40 and the circuit board 7. The results are illustrated by a white bar graph in FIG. 8. As illustrated in FIG. 8, it can be found that the sensitivity values of the button positions P1 to P8 greatly exceeded the threshold value "V" in the ordinary switching device. In other words, it can be found that the sensitivity values of the ordinary switching device were so high that erroneous detection occurred even when the central part that had no relation to the button positions P1 to P8 was pushed by a finger.

Thus, the air layers 6a and 6b are arranged between the holding member 40 and the circuit board 7, and thus, erroneous detection does not occur even when the central part, which has no relation to the button positions P1 to P8, is pushed by a finger. Hence, it can be found that it is possible to suppress malfunction caused by a touch operation of a finger or the like on the touch panel member 30.

In the aforementioned, the arrangement position of the concave parts 60a and 60b has been explained with reference to FIG. 7, and, this is merely an example and not limited thereto.

It is preferable that the thickness of the air layers 6a and 6b is set at a thickness for allowing the sensitivity value which is higher than a threshold value of noise other than static electricity to be maintained, or less. The thickness of the air layers 6a and 6b may be set to include tolerance so that the thickness of the air layer 6a or 6b is not small or zero by a secular change or an error in manufacturing and assembling of the switching device 1.

It is preferable that the air layers 6a and 6b are formed so as to surround respective peripheries of operation regions (operation buttons) in which the drawing patterns that indicate instruction contents such as TUNE, ENTER, MODE, VOL, and CH•FLD are formed.

Figure 9A:
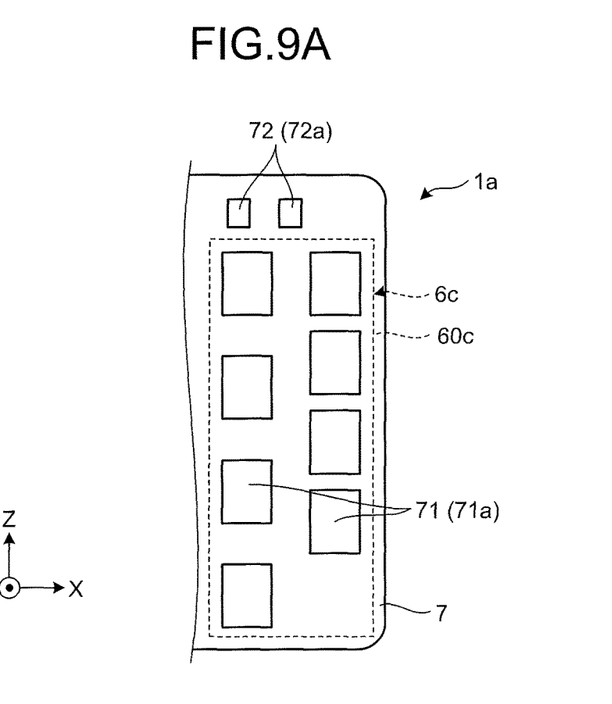
FIG. 9A is a diagram illustrating arrangement of concave parts according to a first variation of the embodiment.
Figure 9B:
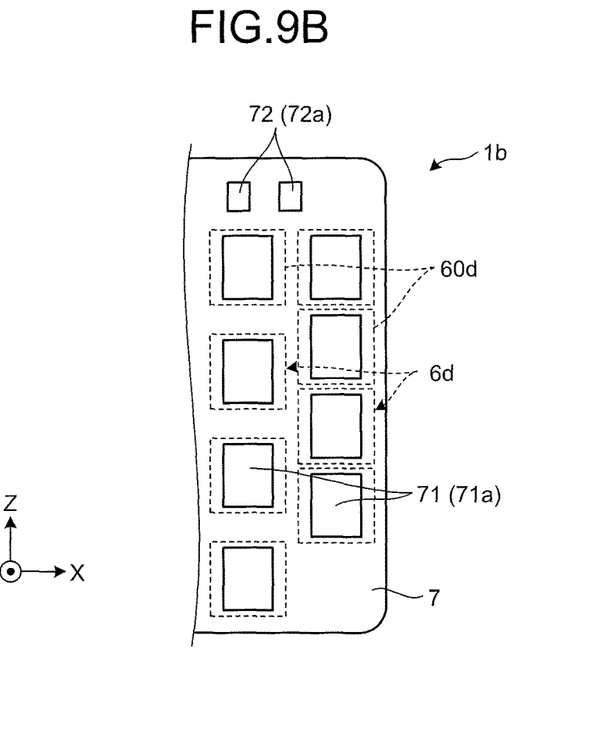
FIG. 9B is a diagram illustrating arrangement of concave parts according to a second variation of the embodiment.

Next, the first and second variations of arrangement of the concave parts will be explained with reference to FIGS. 9A and 9B. FIG. 9A is a diagram illustrating arrangement of a concave part 60c according to a first variation of the embodiment. FIG. 9B is a diagram illustrating arrangement of concave parts 60d according to a second variation of the embodiment.

Among components illustrated in FIGS. 9A and 9B, the same components as those illustrated in FIG. 7 will be provided with the same reference symbols as those illustrated in FIG. 7 to omit explanation thereof herein. Moreover, in FIGS. 9A and 9B, for the convenience of understanding, illustration of the holding member 40 will be omitted and the concave parts 60c and 60d will be illustrated by dashed lines.

As illustrated in FIG. 9A, a switching device 1a according to the first variation includes one concave part 60c. The concave part 60c is arranged on the back face of the holding member 40 so as to cover all of the eight electrodes 71 (71a) that are arranged in a 4-by-2 matrix on the surface of the circuit board 7 with respect to the Z-axis direction.

In the first variation, one air layer 6c is formed by a space that is formed by the one concave part 60c arranged on the back face of the holding member 40. In other words, the air layer 6c is arranged between the holding member 40 and the circuit board 7 so as to cover all of the eight electrodes 71 (71a) that are arranged in a 4-by-2 matrix on the surface of the circuit board 7 with respect to the Z-axis direction.

The aforementioned switching device 1a according to the first variation includes the air layer 6c that is arranged between the holding member 40 and the circuit board 7. Therefore, even when the panel body 2 and the circuit board 7 are strained to generate an unintended minute gap between the circuit board 7 and the light guiding body 4, the switching device 1a can prevent touch detection caused by a touch operation of a finger or the like on the touch panel member 30 from being unstable.

In the switching device 1a, the air layer 6c covers all of the eight electrodes 71 (71a) that are arranged in a 4-by-2 matrix on the surface of the circuit board 7 with respect to the Z-axis direction, and thus, dispersion of a change rate of electrostatic capacitance in the light guiding body 4 (4a) can be reduced by the air layer 6c.

As illustrated in FIG. 9B, in a switching device 1b according to the second variation, the concave parts 60d are arranged on the back face of the holding member 40 so as to correspond to the respective eight electrodes 71 (71a) that are arranged in a 4-by-2 matrix on the surface of the circuit board 7 with respect to the Z-axis direction.

In the second variation, the eight air layers 6d are formed by spaces that are formed by the eight concave parts 60d arranged on the back face of the holding member 40. In other words, the air layers 6d are arranged between the holding member 40 and the circuit board 7 so as to cover the respective eight electrodes 71 (71a) that are arranged in a 4-by-2 matrix on the surface of the circuit board 7 with respect to the Z-axis direction.

The aforementioned switching device 1b according to the second variation includes the air layers 6d that are arranged between the holding member 40 and the circuit board 7. Therefore, even when the panel body 2 and the circuit board 7 are strained to generate an unintended minute gap between the circuit board 7 and the light guiding body 4, the switching device 1b can prevent touch detection caused by a touch operation of a finger or the like on the touch panel member 30 from being unstable.

Moreover, the air layers 6d of the switching device 1b cover the respective eight electrodes 71 (71a) that are arranged in a 4-by-2 matrix on the surface of the circuit board 7 with respect to the Z-axis direction, and thus, malfunction between the adjacent electrodes 71 (71a) can be prevented more reliably.

Specifically, the respective electrodes 71 (71a) are partitioned by the concave parts 60d to form partition walls between the electrodes 71 (71a), and thus, changes in the air layers 6d for push or the like are small so that it is possible to prevent malfunction between the adjacent electrodes 71 (71a) more reliably.

The switching devices 1 and 1b according to the aforementioned embodiment include the concave parts 60a, 60b, and 60d that are arranged on the back face of the holding member 40 so as to correspond to the electrodes 71 (71a) arranged on the surface of the circuit board 7, and, are not limited thereto.

The holding members 40 of switching devices according to other embodiments include the concave parts that are arranged so as to correspond to the electrodes 71 as well as concave parts that are arranged in regions other than those corresponding to the electrodes 71.

Figure 10A:
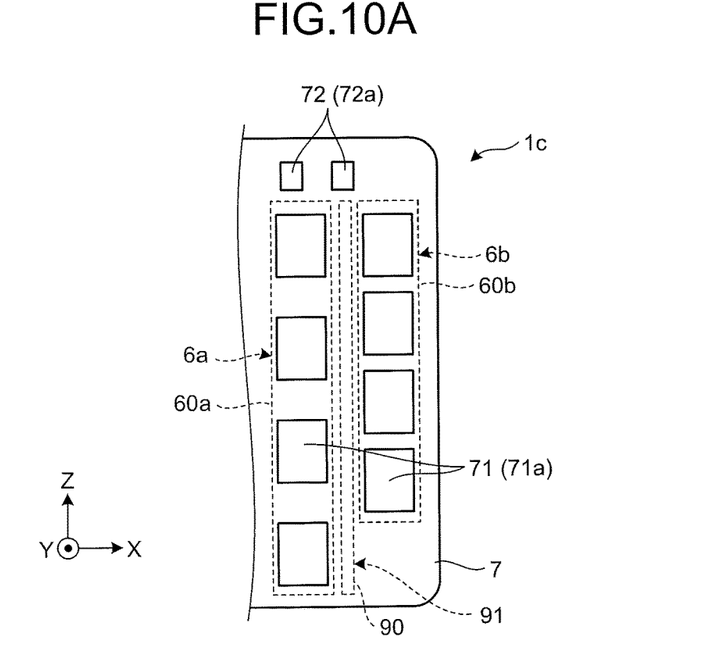
FIG. 10A is a diagram illustrating arrangement of other concave parts according to a third variation of the embodiment.
Figure 10B:
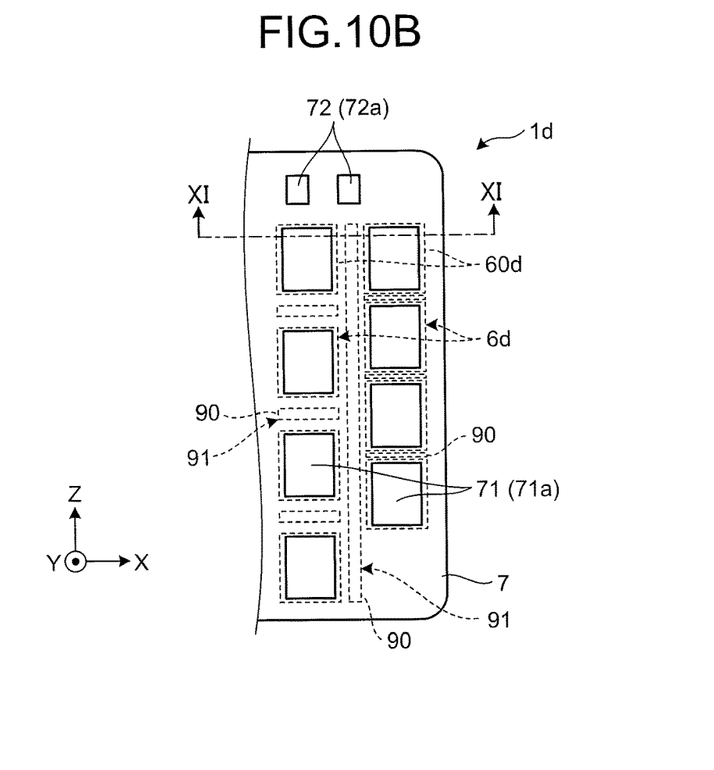
FIG. 10B is a diagram illustrating arrangement of other concave parts according to a fourth variation of the embodiment.

Arrangement of other concave part(s) 90 will be explained with reference to FIGS. 10A and 10B. FIG. 10A is a diagram illustrating arrangement of the other concave part 90 according to a third variation of the embodiment. FIG. 10B is a diagram illustrating arrangement of the other concave parts 90 according to a fourth variation of the embodiment.

Among components illustrated in FIGS. 10A and 10B, the same components as those illustrated in FIGS. 7 and 9B will be provided with the same reference symbols as those illustrated in FIGS. 7 and 9B to omit explanation thereof herein.

As illustrated in FIG. 10A, a switching device 1c according to the third variation includes the other concave part 90. The other concave part 90 is arranged in the Z-axis direction in a region between the concave parts 60a and 60b on the back face of the holding member 40.

In the third variation, a middle air layer 91 is formed by a space that is formed by the other concave part 90 arranged on the back face of the holding member 40. In other words, the middle air layer 91 is arranged between the air layers 6a and 6b arranged on the back face of the holding member 40.

As illustrated in FIG. 10B, the other concave parts 90 of a switching device 1d according to the fourth variation are individually arranged in the Z-axis and X-axis directions in regions between the adjacent concave parts 60d on the back face of the holding member 40.

In the fourth variation, a plurality of the middle air layers 91 is formed by a plurality of spaces that is formed by a plurality of the other concave parts 90 arranged on the back face of the holding member 40. In other words, the respective middle air layers 91 are arranged between the adjacent air layers 6d arranged on the back face of the holding member 40.

Thus, the middle air layer 91 of the switching device 1c according to the aforementioned third variation is arranged between the air layers 6a and 6b that are arranged on the back face of the holding member 40, and the respective middle air layers 91 of the switching device 1d according to the aforementioned fourth variation are arranged between the adjacent air layers 6d that are arranged on the back face of the holding member 40.

Therefore, in the switching devices 1c and 1d, the middle air layer(s) 91 separate(s) the air layers 6a and 6b, or 6d, and thus, malfunction between the adjacent electrodes 71 (71a) can be prevented more reliably.

Figure 11:
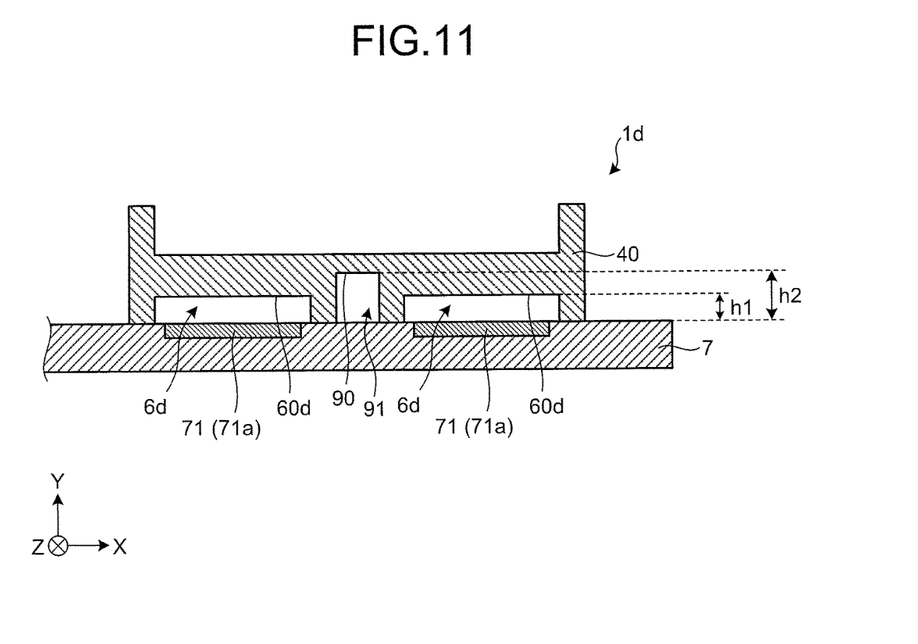
FIG. 11 is a cross-sectional view illustrating the arrangement of other concave parts according to the fourth variation along line XI-XI in FIG. 10B.

It is desirable that the thickness of the middle air layer(s) 91 is larger than those of the air layers 6a, 6b, and 6d. This point will be explained specifically with reference to FIG. 11. FIG. 11 is a cross-sectional view illustrating the switching device 1d according to the fourth variation along line XI-XI in FIG. 10B. Among components illustrated in FIG. 11, the same components as those illustrated in FIG. 6 will be provided with the same reference symbols as those illustrated in FIG. 6 to omit explanation thereof herein.

As illustrated in FIG. 11, the switching device 1d is formed so that the thickness "h2" of the middle air layer 91 is larger than the thickness "h1" of the air layers 6d. Specifically, in a case where the thickness "h1" of the air layers 6d is, for example, 0.3 mm, the thickness "h2" of the middle air layer 91 is, for example, 1.0 mm.

Thus, in a case where the thickness "h2" of the middle air layer 91 is larger than the thickness "h1" of the air layers 6d, the electric permittivity of a part between the adjacent electrodes 71 (71a) is reduced to decrease the sensitivity of a touch with a finger or the like, and thus, malfunction between the adjacent electrodes 71 (71a) can be prevented more reliably.

In the aforementioned embodiment, the air layers 6 are arranged between the holding member 40 and the circuit board 7, and is not limited thereto. The air layers 6 may be arranged at other positions, for example, between the touch panel member 30 and the light guiding member 50, between the light guiding member 50 and the holding member 40, etc.

Figure 12A:
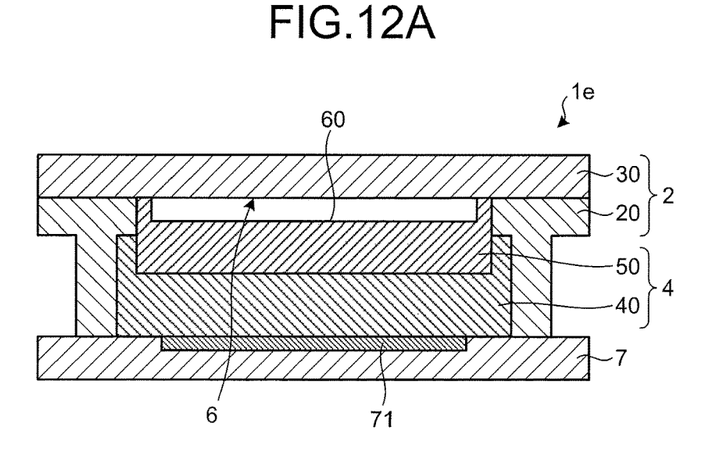
FIG. 12A is a schematic cross-sectional view illustrating a switching device according to a fifth variation of the embodiment.
Figure 12B:
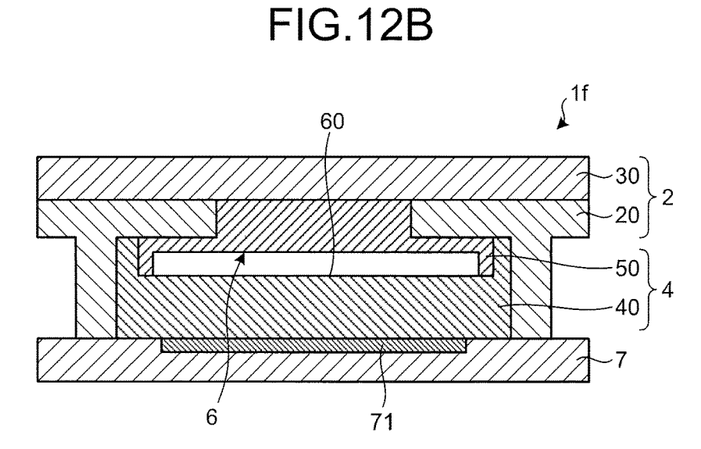
FIG. 12B is a schematic cross-sectional view illustrating a switching device according to a sixth variation of the embodiment.
Figure 12C:
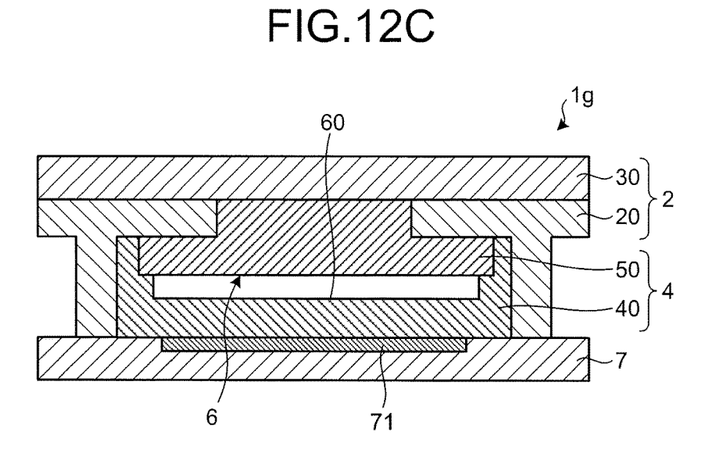
FIG. 12C is a schematic cross-sectional view illustrating a switching device according to a seventh variation of the embodiment.

An arrangement position of the air layer 6 will be explained with reference to FIGS. 12A to 12C. FIG. 12A is a schematic cross-sectional view illustrating a switching device 1e according to a fifth variation of the embodiment. FIG. 12B is a schematic cross-sectional view illustrating a switching device if according to a sixth variation of the embodiment. FIG. 12C is a schematic cross-sectional view illustrating a switching device 1g according to a seventh variation of the embodiment.

Among components illustrated in FIGS. 12A to 12C, the same components as those illustrated in FIG. 1 will be provided with the same reference symbols as those illustrated in FIG. 1 to omit explanation thereof herein.

As illustrated in FIG. 12A, in a case where the air layer 6 is arranged between the touch panel member 30 and the light guiding member 50, a space is formed by the concave part 60 that is arranged at the position corresponding to the electrode 71 of the circuit board 7 on the front face of the light guiding member 50.

Moreover, as illustrated in FIGS. 12B and 12C, in a case where the air layer 6 is arranged between the light guiding member 50 and the holding member 40, a space is formed by the concave part 60 (see FIG. 12B) that is arranged at the position corresponding to the electrode 71 of the circuit board 7 on the back face of the light guiding member 50, or by the concave part 60 (see FIG. 12C) that is arranged at the position corresponding to the electrode 71 of the circuit board 7 on the front face of the holding member 40.

In any case, even when the panel body 2 and the circuit board 7 are strained to generate an unintended minute gap between the circuit board 7 and the light guiding body 4, the switching devices 1e to 1g can prevent touch detection caused by a touch operation of a finger or the like on the touch panel member 30 from being unstable.

In the aforementioned embodiments, the air layer 6 is arranged between the holding part 40 and the circuit board 7, between the touch panel member 30 and the light guiding member 50, or between the light guiding member 50 and the holding part 40, however, is not limited thereto.

As another embodiment, the air layer 6 may be provided between the holding part 40 and the circuit board 7, and the air layer 6 may be additionally provided between the touch panel member 30 and the light guiding member 50. As another embodiment, the air layer 6 may be provided between the holding part 40 and the circuit board 7, and the air layer 6 may be additionally provided between the light guiding member 50 and the holding part 40. As another embodiment, the air layer 6 may be provided between the touch panel member 30 and the light guiding member 50, and the air layer 6 may be additionally provided between the light guiding member 50 and the holding part 40. Moreover the thickness of the aforementioned air layers 6 may be equal to or different from each other.

In any aforementioned embodiment, even when the panel body 2 and the circuit board 7 are strained to generate an unintended minute gap between the circuit board 7 and the light guiding body 4, the switching device according to the embodiment can prevent the touch detection caused by the touch operation of a finger or the like to the touch panel member 30 from being unstable.

The surface of the touch panel member 30 in any one of the aforementioned switching devices 1 and 1a to 1g according to the embodiment may have the curvature that is preliminarily determined by design. Also in such a case, each of the switching devices 1 and 1a to 1g includes the air layer 6, so that it is possible to prevent touch detection caused by a touch operation of a finger or the like on the touch panel member 30 from being unstable.

In any of the switching devices 1 and 1a to 1g, in a case where the curvature of the surface of the touch panel member 30 is increased, the thickness of the air layer 6 may be adjusted depending on the value of the curvature of the surface of the touch panel member 30.

The light guiding body 4 of each of the aforementioned switching devices 1 and 1a to 1g according to the embodiment is constituted of the light guiding member 50 and the holding member 40, which are separately arranged, and the light guiding body 4 may be constituted of the light guiding member 50 and the holding member 40, which are integrated with each other. Thereby, the number of parts can be reduced, so that it is possible to simplify assembly processes of the switching devices 1 and 1a to 1g.

In the aforementioned embodiment, the cases in which the switching devices 1 and 1a to 1g are applied to the on-vehicle device 10 have been explained, and may be applied to, for example, an audio device that reproduces music data, etc.

According to an aspect of the embodiment, a switching device can be provided that can prevent touch detection caused by a touch operation on a touch panel member from being unstable.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A switching device comprising:
   a circuit board that is provided with a plurality of electrodes, each electrode of the plurality of electrodes detecting a change in electrostatic capacitance that is caused by a touch operation of a user;
   a laminated body that is laminated on the circuit board, the laminated body including a touch panel member that receives the touch operation; and
   a plurality of air layers, each air layer being arranged at a position that corresponds to at least one electrode between the circuit board and the laminated body, the plurality of air layers being formed on a same circuit board layer,
   the plurality of air layers keeping constant gaps between the plurality of electrodes and the touch panel member when the user introduces a touch input onto the touch panel member, wherein
   each of the plurality of the air layers is isolated from each other, each of the plurality of the air layers covering, when viewed from a top of the switching device, one or more corresponding electrodes of the plurality of electrodes.

2. The switching device according to claim 1, wherein the laminated body is arranged between the touch panel member and the circuit board, the laminated body includes a light guiding member that guides light toward the touch panel member, and each of the air layers is arranged between the light guiding member and the touch panel member and/or between the light guiding member and the circuit board.

3. The switching device according to claim 2, wherein each of the air layers is a space that is formed by a concave part that is arranged in the light guiding member.

4. The switching device according to claim 1, wherein the laminated body is arranged between the touch panel member and the circuit board, the laminated body includes
   a light guiding member that guides light toward the touch panel member, and a holding member that is arranged between the light guiding member and the circuit board, the holding member holding the light guiding member, and
   each of the air layers is arranged between the light guiding member and the holding member and/or between the holding member and the circuit board.

5. The switching device according to claim 4, wherein each of the air layers is a space that is formed by a concave part that is arranged in the holding member.

6. The switching device according to claim 4, wherein the holding member includes a wall part that is elastically deformed by contact with the touch panel member.

7. The switching device according to claim 5, wherein the holding member includes a wall part that is elastically deformed by contact with the touch panel member.

8. The switching device according to claim 1, wherein each of the air layers is arranged to correspond to at least two of the electrodes.

9. The switching device according to claim 2, wherein each of the air layers is arranged to correspond to at least two of the electrodes.

10. The switching device according to claim 3, wherein each of the air layers is arranged to correspond to at least two of the electrodes.

11. The switching device according to claim 4, wherein each of the air layers is arranged to correspond to at least two of the electrodes.

12. The switching device according to claim 5, wherein each of the air layers is arranged to correspond to at least two of the electrodes.

13. The switching device according to claim 1, wherein the switching device is provided with a middle air layer that is separately arranged, when viewed from the top of the switching device, between adjacent air layers of the plurality of the air layers, the middle air layer not including any of the electrodes.

14. The switching device according to claim 8, wherein a middle air layer that is arranged between adjacent air layers of the plurality of the air layers.

15. The switching device according to claim 1, wherein a thickness of the air layer is 0.1 to 0.5 mm.

\* \* \* \* \*